United States Patent [19]

Flowers

[11] 3,932,685

[45] Jan. 13, 1976

[54] ALUMINUM STABILIZATION PROCESS AND STABILIZATION SOLUTION THEREFOR

[75] Inventor: Dervin L. Flowers, Scottsdale, Ariz.

[73] Assignee: Motorola, Inc., Chicago, Ill.

[22] Filed: Nov. 9, 1973

[21] Appl. No.: 414,587

[52] U.S. Cl. .................. 427/352; 427/88; 427/92; 427/380; 427/383; 427/436; 106/1
[51] Int. Cl.$^2$.................... B05D 3/00; C09D 5/00
[58] Field of Search........ 117/201, 215, 227, 130 E, 117/50, 213; 106/47, 1, 48; 29/569; 357/52; 427/352, 383, 380, 435, 436, 88, 92

[56] References Cited

UNITED STATES PATENTS

| | | | |
|---|---|---|---|
| 3,458,344 | 7/1969 | Little | 106/48 |
| 3,463,646 | 8/1969 | Little | 106/48 |
| 3,672,964 | 6/1972 | Bellis | 117/50 |
| 3,689,292 | 9/1972 | Preston | 117/130 E |
| 3,738,849 | 6/1973 | Bellis | 117/130 E |
| 3,770,498 | 11/1973 | Flowers | 117/201 |

Primary Examiner—Michael F. Esposito
Attorney, Agent, or Firm—Harry M. Weiss; Henry T. Olsen

[57] ABSTRACT

A process for the stabilization of an aluminum part, such as a semiconductor lead frame, which includes the step of coating said aluminum part with an alcohol solution containing boron, phosphorous and a metal selected from the group consisting of gold, palladium, rhodium and platinum. The solution is prepared by mixing phosphorous pentoxide in an alcohol solvent. The dissolution of the phosphorous pentoxide is exothermic and the temperature of the solution will rise during the reaction. Then, boric anhydride and a salt of gold, palladium, rhodium or platinum is added. The solution strips any aluminum oxide from the surface of the part while also removing any organic contamination and while depositing a layer of the gold, platinum, rhodium or palladium onto the surface of the aluminum part. The process is particularly advantageous for preparing aluminum lead frames for wire bonding during semiconductor device assembly.

4 Claims, No Drawings

ALUMINUM STABILIZATION PROCESS AND STABILIZATION SOLUTION THEREFOR

RELATED APPLICATION

This invention is related to application Ser. No. 408,776 filed Oct. 23, 1973.

BACKGROUND OF THE INVENTION

This invention relates to the processing of aluminum parts and, more particularly, to the stabilization of the surface of aluminum lead frames for semiconductor devices.

In the assembly of semiconductor devices, a lead frame which provides a mounting for the semiconductor chip, plus electrical terminals for the completed device is utilized. Typically, the lead frame is of aluminum or is aluminum surfaced because the metallization on the semiconductor chip is of aluminum, thus an aluminum wire is used to bond between the electrical contact pads on the chip and to the aluminum or aluminum coated lead frame without the electromigration problems that might be associated with the utilization of dissimilar metals. Prior to the bonding between the chip and the lead frame, it is customary to use a form of a degreasing operation, such as immersing the lead frames in freon. Due to the extreme chemical activity of aluminum, the parts, after removal from the freon, become or remain coated with thin films of aluminum oxide, which limit the pull strength of the wire bonds made thereto.

SUMMARY OF THE INVENTION

It is an object of this invention to provide an improved process for the cleaning of aluminum or aluminum surfaced parts.

A further object of the invention is to provide a cleaning process and solution for the treatment of aluminum or aluminum surfaced semiconductor lead frames.

A further object of the invention is to provide a process and solution for the cleaning and coating of aluminum surfaced lead frames in preparation for bonding of semiconductors thereto.

In accordance with these objects, there is provided a process for the stabilization and cleaning of an aluminum part which comprises the step of immersing said lead frame in an alcohol solution containing boron, phosphorous and a metal elected from the group consisting of gold, palladium, rhodium and platinum.

A further object of the invention is to provide a process for the improvement of the pull strength of the wire bonds in semiconductor device processing.

Further objects and advantages of the invention will be understood from the following complete description thereof.

COMPLETE DESCRIPTION

In accordance with the particular embodiment of the invention, the process is one for removing organic contamination from a semiconductor lead frame prior to wire bonding. During this process, the ever present skin of aluminum oxide on such aluminum striped lead frames is also removed. Both the organic contamination and the aluminum oxide act to inhibit wire bonding strength and quality. During the process, the aluminum is plated with an inert noble metal, which prevents regrowth of a new layer of oxide on the lead frame when it is subsequently exposed to air. Results show that the treatment persists even if the treated lead frame is held four weeks before utilized in the wire bonding assembly operation.

The process functions by deposition from a selected organic solvent of a thin adherent layer of an inert noble metal, such as gold, palladium, platinum or rhodium, on the aluminum. The noble metal layer may be considered mono-atomic in thickness, and is stable to ambient conditions of temperature and humidity, thereby preventing reforming of the skin of aluminum oxide.

The solution used in the process is a solution of phosphorous pentoxide, boric anhydride and a noble metal salt, such as potassium, gold cyanide, potassium gold chloride, palladium chloride or similar salts of rhodium and platinum. A concentration of dissolved solids of from 0.5 to 4 percent with an atomic ratio of phosphorous-boron-noble metal of 1:3:0.1 has been used. The phosphorous-boron solution serves as the carrier to solubilize the noble metal salt.

A typical solution is prepared by dissolving 1 to 30 grams per liter phosphorous pentoxide in various alcohols, such as isopropyl alcohol. This reaction is exothermic and results in a rise in temperature of the solution. To this solution is added 1 to 60 grams per liter boric anhydride to form a boron phosphorous ration in the solution of at least 3:1. This ratio is necessary to prevent hydroscopic side effects after the solution has been dried following treatment in accordance with the process. The foregoing solution forms a stock base solution to which 0.01 to 10 grams per liter noble metal salt will be added prior to use. The noble metal salt should not be added too long ahead of time, since even on inert plastic surfaces, plating of the noble metal will occur spontaneously over a period of a few days. When it is desired to treat the parts in accordance with the subject process, a sufficient amount of the noble metal salt is added to the stock base solution to form a ratio of boron phosphorous to noble metal of 1:3:0.1. Solution can be generally affected by shaking or stirring in a matter of minutes.

To treat the parts in accordance with the process, a preliminary degreasing in isopropyl alcohol may be utilized, although this is not necessary. The parts are added to the above disclosed solution at room temperature, until an absorption or immersion plating equilibrium is approached. The solution is then decanted from the parts and the parts are rinsed with an alcohol, such as methanol, and air dried. Preferably, the parts are then baked for 30 minutes in air at 200°C. Following this treatment, the parts are ready for further assembly.

EXAMPLE I

A preliminary solution was prepared by dissolving 16 grams of phosphorous pentoxide in 500 milliliters of isopropyl alcohol. To this solution is added 28 grams of boric anhydride, which dissolves in a matter of minutes. The solution is then diluted with another 1000 milliliters of isopropyl alcohol. To 100 milliliters of the foregoing diluted stock solution was then added 0.2 grams of potassium gold cyanide. Solution of the potassium gold cyanide is affected in about 10 minutes by shaking. This solution is then diluted by addition of 500 milliliters of isopropyl alcohol and 100 dual-in-line lead frames immersed therein for 5 minutes. The solution is then decanted from the parts, and the parts are rinsed for 3 to 5 seconds in absolute methanol. The parts are then air dried. Within 1 day, the parts were assembled by wire bonding to semiconductor chips and tested for their pull strength. The results, as compared with standard degreased parts demonstrate that the peak bond strength has been increased from five to seven grams, while parts having a pull strength of less than six grams have been eliminated.

EXAMPLE II

A solution was prepared by dissolving 16 grams of phosphorous pentoxide in 500 milliliters of isopropyl alcohol. To this solution was added 28 grams of boric anhydride, which dissolved therein, and the solution was diluted with 1000 milliliters of isopropyl alcohol. To 100 milliliters of this solution was then added 0.2 grams of potassium gold cyanide and solution was affected in approximately 10 minutes. 100 dual-in-line lead frames were immersed in this solution for 8 minutes, and the solution decanted. The parts were then given a quick rinse — 2 to 5 seconds in absolute methanol and air dried. The parts were then stored for 3 weeks, prior to assembly. Following assembly, the parts were tested for pull strength, as compared with a similar number of freon degreased parts, and results indicate that the maximum value of wire pull strength is shifted from five grams for the regular units to 8.5 grams for products treated in accordance with the invention, which is an increase of 70 percent in strength.

Additionally, the low end of the new process distribution is at least one gram above the maximum in pull strength achieved by the prior art process.

While the invention has been disclosed by way of certain preferred embodiments and examples thereof, it will be appreciated that suitable modifications may be made therein without departing from the spirit and scope of the invention.

What is claimed is:

1. In a process of manufacturing aluminum parts which are to be bonded to other parts, the improvement which comprises the step of coating the aluminum parts with a complex solution containing 1 to 30 grams per liter phosphorous pentoxide, 1 to 60 grams per liter boric anhydride, 0.01 to 10.0 grams per liter of a material elected from the group consisting of gold, platinum, palladium and rhodium salts and oxides.

2. In a process as recited in claim 1 wherein said coating step includes immersing the parts in said complex solution and drying the device in air.

3. In a process as recited in claim 1 wherein said coating step includes covering the surface of said parts with said complex solution, rinsing the surface of said device with an alcohol, and drying said device.

4. In a process as recited in claim 3 wherein the device is then baked at a temperature of approximately 200°C.

* * * * *